US011605732B2

(12) United States Patent
Cho et al.

(10) Patent No.: US 11,605,732 B2
(45) Date of Patent: Mar. 14, 2023

(54) POWER DEVICE WITH GRADED CHANNEL

(71) Applicant: SEMICONDUCTOR COMPONENTS INDUSTRIES, LLC, Phoenix, AZ (US)

(72) Inventors: Kevin Kyuheon Cho, Bucheon-si (KR); Bongyong Lee, Seoul (KR); Kyeongseok Park, Bucheon (KR); Doojin Choi, Gimpo-si (KR); Thomas Neyer, Munich (DE); James Joseph Victory, Weyarn (DE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/675,813

(22) Filed: Nov. 6, 2019

(65) Prior Publication Data

US 2021/0134997 A1    May 6, 2021

(51) Int. Cl.
 *H01L 29/78* (2006.01)
 *H01L 21/04* (2006.01)
 *H01L 29/66* (2006.01)
 *H01L 29/16* (2006.01)

(52) U.S. Cl.
 CPC ........ *H01L 29/7802* (2013.01); *H01L 21/046* (2013.01); *H01L 29/1608* (2013.01); *H01L 29/66068* (2013.01)

(58) Field of Classification Search
 CPC .......... H01L 29/7802; H01L 29/66068; H01L 29/1608; H01L 21/046; H01L 29/0878; H01L 29/7395; H01L 29/1045; H01L 29/1095; H01L 29/7827; H01L 29/1033; H01L 29/36
 See application file for complete search history.

(56) References Cited

U.S. PATENT DOCUMENTS

| 2004/0104429 | A1* | 6/2004 | Takahashi | ........... H01L 29/0623 257/338 |
| 2004/0142515 | A1  | 7/2004 | Assaderaghi et al. | |
| 2007/0148926 | A1  | 6/2007 | Datta et al. | |
| 2019/0074373 | A1* | 3/2019 | Kobayashi | .......... H01L 29/0623 |

FOREIGN PATENT DOCUMENTS

WO    WO-2010110893 A1 *  9/2010    ......... H01L 29/1045

* cited by examiner

*Primary Examiner* — Ermias T Woldegeorgis
(74) *Attorney, Agent, or Firm* — Brake Hughes Bellermann LLP

(57) ABSTRACT

A power device includes a silicon carbide substrate. A gate is provided on a first side of the silicon carbide substrate. A graded channel includes a first region having a first dopant concentration and a second region having a second dopant concentration, the second dopant concentration being greater than the first dopant concentration.

18 Claims, 5 Drawing Sheets

_(12) United States Patent — US 11,605,732 B2_

POWER DEVICE WITH GRADED CHANNEL

BACKGROUND OF THE INVENTION

The present disclosure relates to a Silicon Carbide (SiC) power semiconductor device.

Power semiconductor devices are used in many different industries. Some of these industries, such as telecommunications, computing, and charging systems, are rapidly developing. Compared to Silicon (Si) power devices, Silicon Carbide (SiC) power devices (e.g., MOSFETs) has lower on-resistance, higher breakdown electric field, higher switching speeds, and higher operation temperature. These characteristics make SiC power devices a better candidate as power devices get smaller in dimensions.

However, as the size of SiC devices scales down, physical properties such as threshold voltage, on-resistance, punch-through, and the like are strongly affected by geometrical profiles. For example, gate surface profile and high interface state density at $SiO_2$/SiC may cause low channel mobility and threshold voltage instability.

BRIEF SUMMARY OF THE INVENTION

In an embodiment, a power semiconductor device includes a silicon carbide substrate, a gate provided on a first side of the silicon carbide substrate, and a graded channel including a first region having a first dopant concentration and a second region having a second dopant concentration. The second dopant concentration is greater than the first dopant concentration.

In an embodiment, the power device further includes a drift layer provided over the silicon carbide substrate; a retrograde well; and a pocket provided within the retrograde well.

In an embodiment, the first region of the graded channel includes a lightly doped region of the retrograde and the second region of the graded channel includes the pocket.

In an embodiment, the drift layer has an n-type conductivity and the retrograde well has a p-type conductivity. The pocket has a p-type conductivity.

In an embodiment, the power device is a MOSFET and the pocket has a shape of a halo when seen from top.

In an embodiment, the second dopant concentration is at least 5 times greater than the first dopant concentration. In an embodiment, the second dopant concentration is at least 10 times greater than the first dopant concentration.

In an embodiment, the power device further includes a source region provided on the first side of the silicon carbide substrate; a drift layer provided over the silicon carbide substrate and having a hexagonal crystal structure; a retrograde well; a pocket provided within the retrograde well; and a drain electrode provided on a second side of the silicon carbide substrate.

In an embodiment, the source region has an n-type conductivity, and the retrograde has a p-type conductivity.

In an embodiment, a method for forming a power semiconductor device is disclosed. The method includes providing a silicon carbide layer of a first conductivity; forming a retrograde well of a second conductivity, the retrograde well having a lightly doped region proximate a surface of the silicon carbide layer and a heavily doped region provided below the lightly doped region; forming a pocket of the second conductivity within the retrograde well, the pocket being a heavily doped region; and forming a gate over the surface of the silicon carbide layer.

In an embodiment, the pocket and the lightly doped region of the retrograde well define a graded channel for the power semiconductor device.

In an embodiment, the method further includes depositing a first layer of material over the silicon carbide layer; and patterning the first layer of material to obtain a first spacer. The pocket is formed by implanting first dopants of the second conductivity into the retrograde well using the first spacer as an implantation mask.

In an embodiment, the first spacer prevents the first dopants from being implanted into a portion of the light doped region of the retrograde, and the first dopants are implanted into the retrograde well without an implantation tilt angle.

In an embodiment, the method further includes depositing a hard mask layer over the silicon carbide layer; and patterning the hard mask layer. The first layer of material is deposited over the patterned hard mask layer and the first spacer is provided on a sidewall of the patterned hard mask layer.

DETAILED DESCRIPTION OF THE INVENTION

Embodiments of the present application relate to a Silicon Carbide power semiconductor device. The power device may be a MOSFET, an IGBT, and the like. For illustrative convenience, the power device may be described herein as a MOSFET.

In an embodiment, the power semiconductor device has a channel having a graded doping profile. The power device may be a SiC MOSFET, e.g., 4H—SiC MOSFET, with a retrograde P-well. A localized heavily doped pocket is formed adjacent to a source region. The graded channel has a lightly doped region and a heavily doped region. The graded channel improves threshold voltage control and prevents punch-through effects. The graded channel also enables a channel length to be reduced without realizing significant adverse short channel effects. The heavily doped pocket is formed in the P-well by implanting dopants without applying a tilt angle. In an implementation, a spacer is used as an implantation mask, so that the heavily doped pocket may be formed using a self-aligned implantation step.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1:
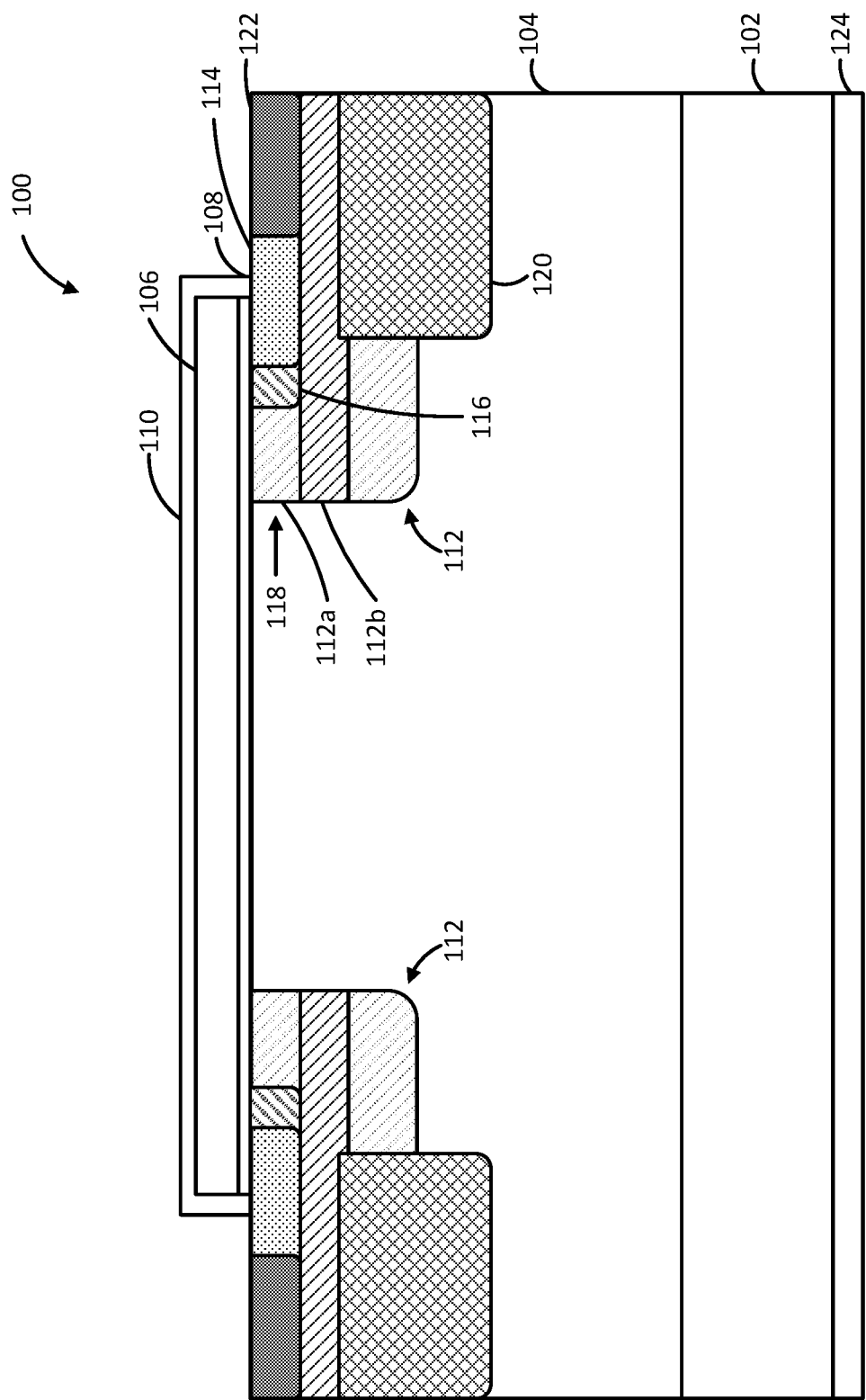
FIG. 1 illustrates a power semiconductor device according to an embodiment.

FIG. 1 illustrates a power semiconductor device 100 according to an embodiment. The power device 100 may be a SiC MOSFET formed on a SiC substrate having hexagonal crystal structure, e.g., 4H—SiC. The power device 100 includes a heavily doped SiC substrate 102 having an n-type conductivity type and a lightly doped SiC layer 104 having an n-type conductivity type that has been epitaxially grown on the substrate 102. A gate 106 is provided over an upper surface of the n-layer 104 (or the drift layer). In other words, the gate 106 is provided on the frontside of the power device 100. The gate 106 includes polysilicon in an embodiment. A gate insulation layer 108 is provided between the gate 106 and the n-layer 104. The gate insulation layer 108 is thermally grown silicon oxide in an implementation but may be other dielectric material such as silicon nitride in other implementations. A gate spacer 110 is formed over the gate 106 to protect the gate.

P-wells 112 are provided in an upper portion of the n-layer 104 and overlap with the gate 106 to define a channel region. In an embodiment, the P-wells are retrograde wells having a retrograde doping profile where a region 112a proximate the upper surface of n-layer 104 is lightly doped and a region 112b deeper within the P-well is heavily doped. As used herein, the upper surface of the n-layer 104 may be referred to as the surface of the n-layer 104 (or the power device 100).

Source regions 114 of an n-type conductivity are formed on the surface of the power device 100 in the P-wells 112. The source regions 114 overlap with the gate 106, so that they can be electrically coupled.

Pockets 116 of a p-type conductivity are formed within the P-wells 112 adjacent to the source regions 114. In an embodiment, the pockets 116 extends vertically at least from the surface of the power device 100 to the heavily doped region 112b of the P-well. In an embodiment, the pockets 116 may have a shape of a halo when seen from the top. The pockets (P-pockets) 116 are heavily doped and serve as part of the graded channel for the power device 100. In an embodiment, the P-pockets 116 are formed using an implantation method that does not utilizing a tilt angle, which simplifies the implantation process, as will be explained subsequently.

A channel region 118 of the power device 100 extends from the source region 114 to the n-layer 104 (or to an edge of the P-well 112). The channel region 118 is a graded channel including the lightly doped region 112a of the P-well and the heavily doped P-pocket 116. The dopant concentration of the heavily doped P-pocket 116 may be 5-20 times greater than that of the lightly doped region 112a. In an embodiment, the dopant concentration of the heavily doped P-pocket 116 is about 10 times greater than that of the lightly doped region 112a.

The lower concentration of impurities in the lightly doped region reduces the surface roughness at the interface of the gate insulation layer 108 and the n-layer 104 (e.g., $SiO_2$/SiC interface). Reduction of the surface roughness increases the carrier mobility in the channel and lowers the on-resistance of the power device. The reduced surface roughness also decreases threshold voltage instability resulting from Coulomb scatterings due to charge traps at the interfacial region.

The graded channel 118 (e.g., the P-pocket 116 provided adjacent to the source region 114) helps control the threshold voltage instability and the punch-through effect. As a result, the threshold voltage variation can be minimized regardless of the variations in local doping profiles, as will be explained subsequently. Additionally, a short channel can be used to obtain low on-resistance and $C_{GS}$ without realizing significant adverse short channel effects.

Referring back to FIG. 1, a heavily doped body 120 of a p-type conductivity is formed in a lower portion of the P-well 112 and extending below the P-well 112 into the n-layer 104. The P-body 120 provides enhanced unclamped inductive switching capability for the power device 100.

A heavily doped stopper region 122 of a p-type conductivity is formed at the upper surface, adjacent to the source region 112. The stopper region 122 directs the current flow to the graded channel 118 and prevents formation of a parasitic transistor.

A drain contact metal 124 is formed over the substrate 102 on the backside of the power device 100. In an embodiment, the drain contact metal 124 includes aluminum and may also include titanium, nickel, and silver.

FIGS. 2-8 illustrates a process for making a SiC MOSFET according to an embodiment. As will be understood by one skilled in the art, the fabrication process may be applicable to other types of power semiconductor devices, such as SiC IGBTs or the like. Similarly, the dimensions, dopant concentrations, materials used, dopant types used, and the like are provided below for illustrative purposes and are not to be used to limit the scope of the invention.

Figure 2:
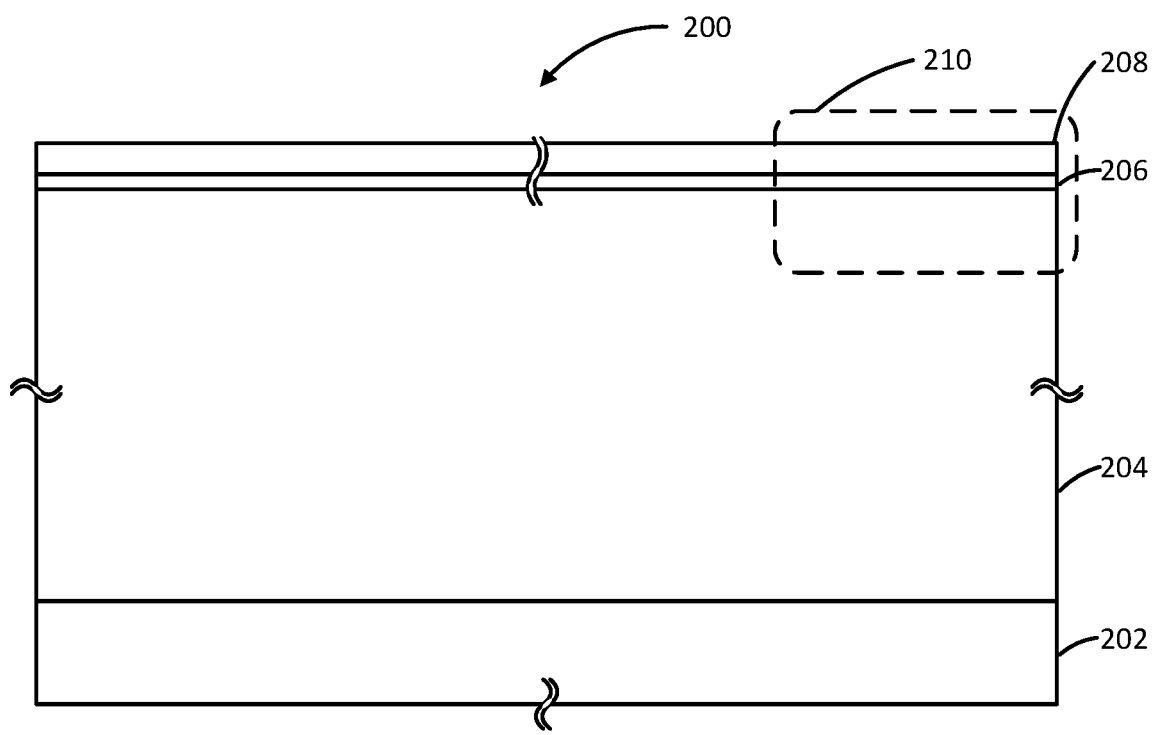
FIGS. 2-8 illustrate a method for fabricating a power semiconductor device having a graded channel according to an embodiment.

FIG. 2 illustrates a substrate 200 according to an embodiment. The substrate 200 includes a SiC substrate 202 that is heavily doped with n-type impurities or dopants. The SiC substrate 202 has crystal structure of 4H hexagonal structure but may have other crystal structures according to implementations. A SiC layer 204 is epitaxially grown on the SiC substrate 202. The SiC epi layer 204 is lightly doped with n-type impurities and prevents current flow until voltage is applied to the power device 100. The SiC layer 204 may also be referred to as a drift layer or drift region.

A first buffer layer 206 is formed over the drift layer 204. In an embodiment, the first buffer layer 206 is a thermally grown oxide layer. The first buffer layer 206 is provided with a sufficient thickness (e.g., about 300-1000 angstroms) to protect the drift layer 204 during subsequent etch processes. A second buffer layer 208 is formed over the first buffer layer 206 to a thickness of about 500-1500 angstroms and is used as an end-point detection layer during a subsequent hard mask etch step. In an embodiment, the second buffer layer 208 is a polysilicon layer.

A dotted line 210 illustrates a portion of the substrate 200 that will be used to illustrate a fabrication process according to an embodiment. The fabrication process will be described using FIGS. 3-8.

Figure 3:
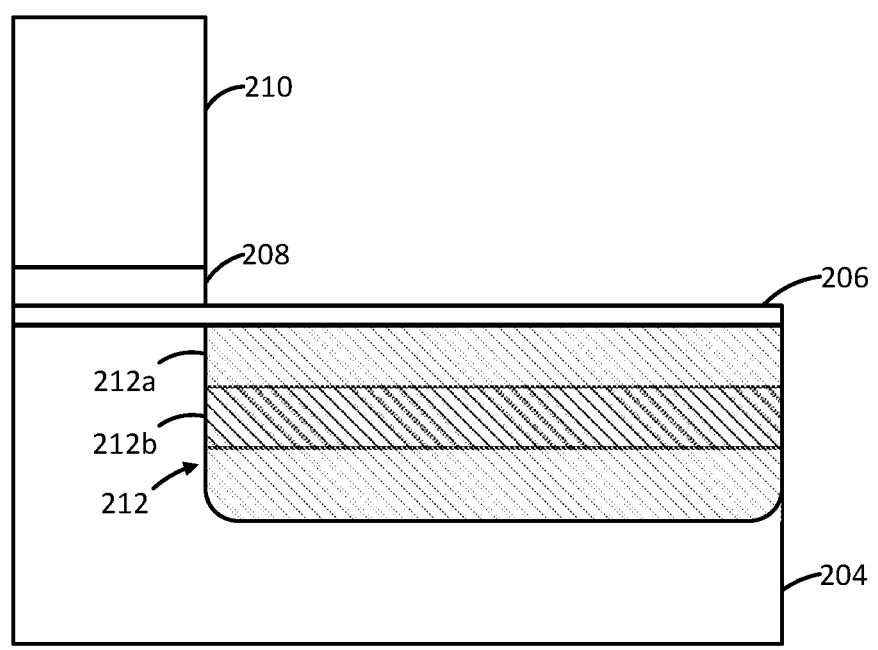

Referring to FIG. 3, a hard mask layer 210 is formed over the polysilicon buffer layer 208. In an embodiment, the hard mask layer 210 is oxide that is grown using plasma enhanced CVD. The hard mask layer 210 is etched to define a P-well region. The second buffer layer 208 underlying the hard mask layer 210 is used as an etch stop layer. The second buffer layer 208 is etched using the patterned hard mask 210.

Dopants (or ions) of a p-type conductivity are implanted through the first buffer layer 206 exposed by etching of the second buffer layer 208 to form a P-well 212 having a retrograde profile and a dopant concentration of $5 \times 10^{17}/cm^3$ to $5 \times 10^{18}/cm^3$. In an implementation, Al ions are implanted into the drift layer 204 using a relatively high implant energy of about 450 keV to inject the ions deeply into the drift layer, e.g., about 0.4 um into the drift layer. The implantation creates a retrograde doping profile having a lightly doped region 212a near the surface and a heavily doped region 212b below it.

Figure 4:
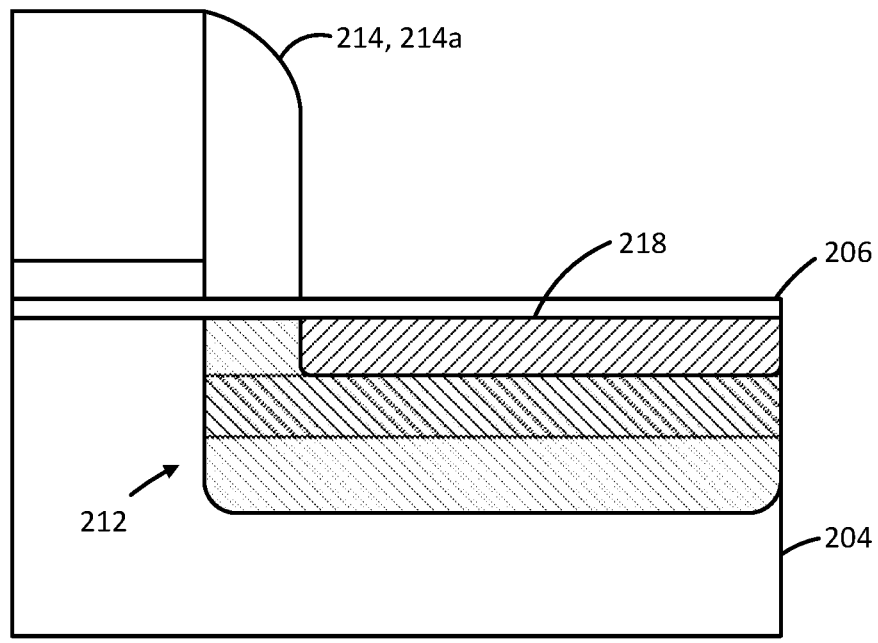

Referring to FIG. 4, a first layer of material 214 is deposited over the substrate. In an embodiment, the first layer of material is polysilicon and is deposited to a thickness of about 0.2-0.6 um. The first layer 214 is etched to form a first spacer 214a. In an embodiment, the first spacer 214a has a lateral dimension of about 0.2 um to about 0.6 um. The first buffer layer 206 protects the drift layer 204 during this etch step.

A heavily doped region 218 of a p-type conductivity is formed by implanting p-type dopants (e.g., Al ions) into the P-well. The first spacer 214a prevents the p-type dopants from being implanted underneath the first spacer 214a, thereby keeping that portion of the P-well 212 as a lightly doped region. In an embodiment, the implantation is a self-aligned implantation step that is performed without a tilt angle, which significantly simplifies the implantation process. Unlike implantation steps for silicon substrate, implantations for SiC substrates are generally conducted at a high temperature while carefully monitoring the temperature. If a tilt angle added, the apparatus needs to be rotated when performing the implantation, and cables needed to monitor the temperature during such an implantation makes the process challenging. The self-aligned implantation using the first spacer 214a eliminates the need for rotating the apparatus while performing the implantation step.

In an embodiment, the implantation step is conducted using Al ions at about 180 keV with the projected range of about 0.1 um. The pocket 218 may have a dopant concentration of about $8 \times 10^{17}/cm^3$.

Figure 5:
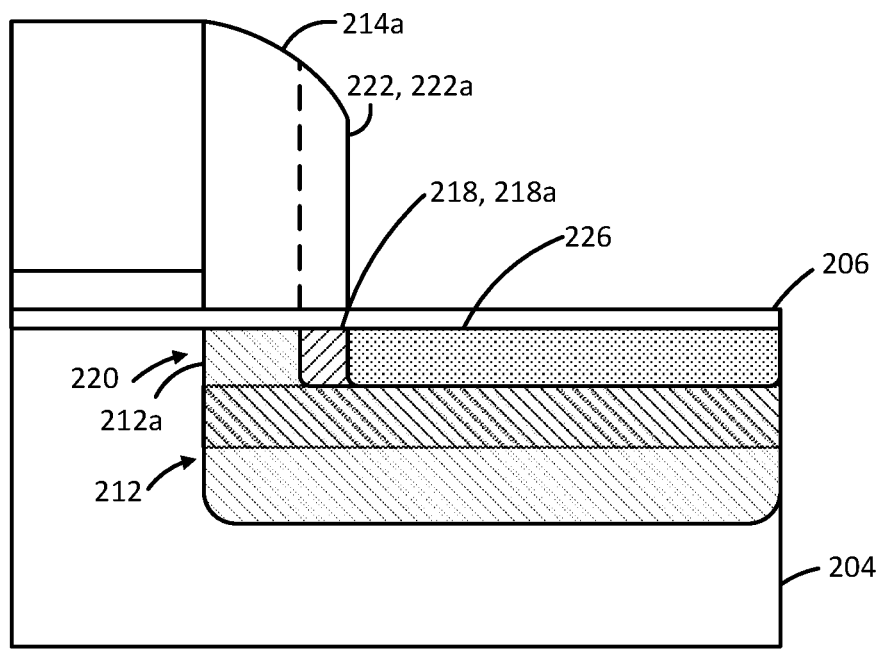

Referring to FIG. 5, a second layer of material 222 is deposited over the first spacer 214a. In an embodiment, the second layer of material 222 is polysilicon and deposited to a thickness of 0.1-0.3 um. The second layer 222 is etched to form a second spacer 222a. In an embodiment, the second spacer 222a has a lateral dimension of about 0.1 um to about 0.3 um. The second buffer layer 206 protects the drift layer 204 during the etch step.

A source region 226 of an n-type conductivity is formed by implanting n-type dopants into the P-well and the region 218. In an embodiment, the implantation is conducted using Phosphorous ions at about 150 keV with the projected range of about 0.1 um. Alternatively, Nitrogen ions or both Phosphorous and Nitrogen ions may be used in other implementations. The source region 226 has a dopant concentration of about $1 \times 10^{20}/cm^3$.

The second spacer 222a prevents the n-type dopants from being implanted underneath the second spacer. As a result, a portion of the region 218 remains a heavily doped p-type region. This remaining portion is referred to as a pocket 218a (or P-pocket). The heavily-doped P-pocket 218a and the lightly doped region 212a define a graded channel 220 that enables the channel length to be shortened without realizing problems associated with short channel effects. The P-pocket 218a helps control the threshold voltage instability that may result from doping profile variations from etching profiles and multiple implantation steps. In an embodiment, the P-pocket 218a has a shape of a halo when seen from top.

Figure 6:
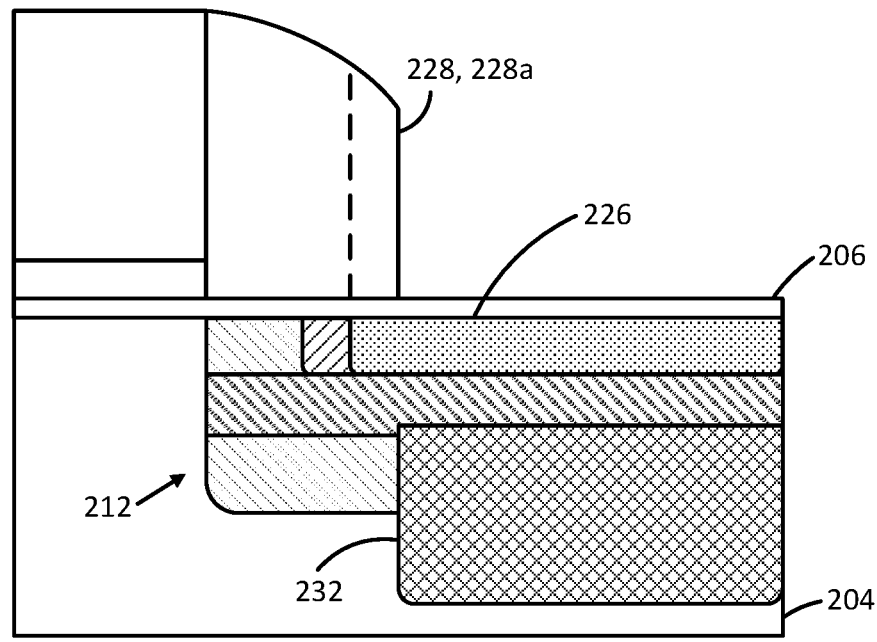

Referring to FIG. 6, a third layer of material 228 is deposited over the second spacer 222a. In an embodiment, the third layer 228 is polysilicon and deposited to a thickness of 0.2-0.6 um. The third layer 228 is etched to form a third spacer 228a. The second buffer layer 206 protects the drift layer 204 during the etch step.

A body 232 (or P-body) of a p-type conductivity is formed by implanting p-type dopants through the P-well 212. In an embodiment, the implantation is conducted using Aluminum ions at about 450 keV with the projected range of about 0.4 um. The P-body 232 is provided below the source region 226 and extends vertically below the P-well 212. The P-body 232 has a dopant concentration of about $3 \times 10^{18}/cm^3$.

Figure 7:
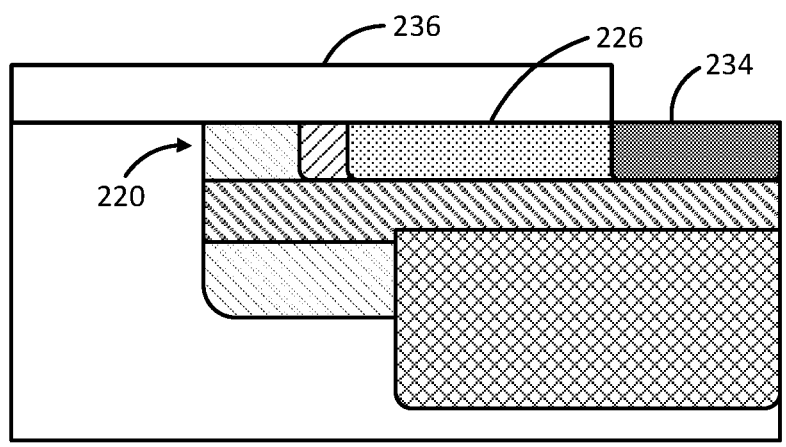

Referring to FIG. 7, the hard mask 210 and the first, second, and third spacers 214a, 222a, and 228a are removed. The remaining second buffer layer 206 is also removed.

A photoresist layer 236 is deposited and patterned to define a stopper region 234 having a p-type conductivity, so that the source region 226 is provided between the graded channel 220 and the stopper region 234. In an embodiment, Aluminum ions are implanted into the stopper region 234 and the photoresist layer 236 is sufficiently thick to serve as an implantation mask.

A high temperature annealing (HTA) is performed to activate the dopants implanted in the substrate. In an embodiment, the HTA is performed at about 1650 degrees Celsius and performed after a graphite coating (not shown) is formed over the substrate. The graphite coating may be used to prevent SiC material from evaporating during the HTA. The graphite coating is removed after the HTA.

In an embodiment, a JFET engineering process may optionally be performed to reduce the effective channel length of the power device (e.g., SiC MOSFET). For example, n-type dopants such as Nitrogen ions are implanted near the surface (or frontside) of the MOSFET. The dopants may be implanted a plurality of times using about 30 keV, about 140 keV, about 230 keV, and about 430 keV and provide each of the regions with a dopant concentration of about $1 \times 10^{17}$ $cm^3$. In an embodiment, the JFET engineering process is performed after the removal of the hard mask 210 and before the HTA.

Figure 8:
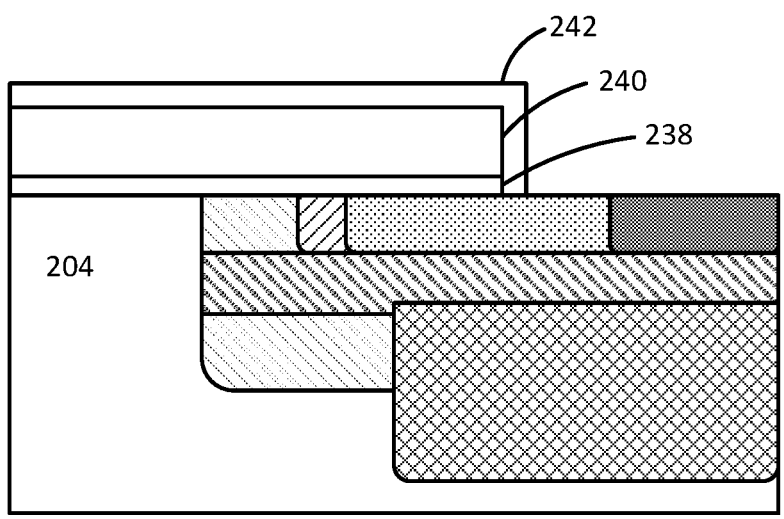

Referring to FIG. 8, a gate insulation layer 238 is formed over the drift layer 204 on the frontside of the substrate. In an embodiment, the gate insulation layer 238 is thermally grown oxide. A gate material is deposited and patterned to form a gate 240. In an embodiment, the gate material is polysilicon. A gate spacer 242 formed to protect the gate 240.

A power semiconductor device formed according to an embodiment may be a SiC MOSFET or the like. FIG. 1 illustrates an example of such a power device.

Aspects of the present disclosure have been described in conjunction with the specific embodiments thereof that are proposed as examples. Numerous alternatives, modifications, and variations to the embodiments as set forth herein may be made without departing from the scope of the claims set forth below. For example, a power device may have a metal pattern with different thicknesses on the front side and another metal pattern with different thicknesses on the backside to enable lifetime control treatment to be performed from the both sides. Accordingly, embodiments as set forth herein are intended to be illustrative and not limiting.

What is claimed is:
1. A power semiconductor device, comprising:
a silicon carbide substrate;
a drift layer of a first conductivity provided over a first side of the silicon carbide substrate;
a gate provided over the drift layer;
a retrograde well having a lightly doped region of a second conductivity proximate to an upper surface of the retrograde well and a heavily doped region of the second conductivity disposed below the lightly doped region;

a pocket of the second conductivity provided within the retrograde well and extending vertically from proximate to the upper surface of the retrograde well down to the heavily doped region; and a graded channel of the second conductivity, the graded channel including a first region having a first dopant concentration and a second region having a second dopant concentration, the second dopant concentration being greater than the first dopant concentration, wherein a type of the first conductivity is different than a type of the second conductivity.

2. The power device of claim 1, further comprising:
a source region provided on the first side of the silicon carbide substrate;
the drift layer having a hexagonal crystal structure; and
a drain electrode provided on a second side of the silicon carbide substrate.

3. The power device of claim 2, wherein the power device is a MOSFET and the pocket has a shape of a halo when seen from top.

4. The power device of claim 3, wherein the source region has an n-type conductivity, and the retrograde well has a p-type conductivity.

5. The power device of claim 1, wherein the pocket has a p-type conductivity.

6. The power device of claim 5, wherein the power device is a MOSFET and the pocket has a shape of a halo when seen from top.

7. The power device of claim 1, wherein the second dopant concentration is at least 5 times greater than the first dopant concentration.

8. The power device of claim 7, wherein the second dopant concentration is at least 10 times greater than the first dopant concentration.

9. The power device of claim 1, wherein the first region of the graded channel includes the lightly doped region of the retrograde well and the second region of the graded channel includes the pocket.

10. The power device of claim 1, wherein the drift layer has an n-type conductivity and the retrograde well has a p-type conductivity.

11. A method for forming a power semiconductor device, the method comprising:
providing a silicon carbide layer;
providing a drift layer of a first conductivity over a first side of the silicon carbide layer;
forming a retrograde well having a lightly doped region of a second conductivity proximate to an upper surface of the retrograde well and a heavily doped region of the second conductivity provided below the lightly doped region;
forming a pocket of the second conductivity within the retrograde well, the pocket extending vertically through the lightly doped region down to the heavily doped region; and
forming a gate over the drift layer,
wherein the pocket and the lightly doped region of the retrograde well define a graded channel, the graded channel comprising a first region having a first dopant concentration and a second region having a second dopant concentration, and the second dopant concentration being greater than the first dopant concentration, and
wherein a type of the first conductivity is different than a type of the second conductivity.

12. The method of claim 11, further comprising:
depositing a first layer of material over the silicon carbide layer; and
patterning the first layer of material to obtain a first spacer, wherein the pocket is formed by implanting first dopants of the second conductivity into the retrograde well using the first spacer as an implantation mask.

13. The method of claim 12, further comprising:
depositing a hard mask layer over the silicon carbide layer; and
patterning the hard mask layer,
wherein the first layer of material is deposited over the patterned hard mask layer and the first spacer is provided on a sidewall of the patterned hard mask layer.

14. The method of claim 13, wherein the first spacer has a lateral dimension of about 0.2 um to about 0.6 um.

15. The method of claim 12, wherein the first spacer prevents the first dopants from being implanted into a portion of the lightly doped region of the retrograde, and the first dopants are implanted into the retrograde well without an implantation tilt angle.

16. The method of claim 11, wherein the power semiconductor device is a MOSFET.

17. The method of claim 11, wherein the pocket has a shape of a halo when seen from top.

18. The method of claim 11, wherein a dopant concentration of the pocket is at least 5 times greater than a dopant concentration of the lightly doped region.

\* \* \* \* \*